US009702040B2

(12) United States Patent
Han et al.

(10) Patent No.: US 9,702,040 B2
(45) Date of Patent: Jul. 11, 2017

(54) SUPER-HYDROPHOBIC THIN FILM AND METHOD FOR PREPARING THE SAME

(71) Applicant: RESEARCH & BUSINESS FOUNDATION SUNGKYUNKWAN UNIVERSITY, Suwon-si (KR)

(72) Inventors: Jeongeon Han, Seoul (KR); Yoonseok Choi, Suwon-si (KR); Su Bong Jin, Suwon-si (KR); Jun Suck Lee, Wonju-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 115 days.

(21) Appl. No.: 14/505,793

(22) Filed: Oct. 3, 2014

(65) Prior Publication Data
US 2015/0240363 A1 Aug. 27, 2015

(30) Foreign Application Priority Data

Feb. 25, 2014 (KR) ........................ 10-2014-0022202

(51) Int. Cl.
C23C 16/40 (2006.01)
C23C 16/509 (2006.01)

(52) U.S. Cl.
CPC .......... C23C 16/401 (2013.01); C23C 16/509 (2013.01)

(58) Field of Classification Search
CPC .................... C23C 16/401; C23C 16/509
See application file for complete search history.

(56) References Cited

U.S. PATENT DOCUMENTS

2010/0143744 A1* 6/2010 Gupta ............... B23K 26/0084
428/601

FOREIGN PATENT DOCUMENTS

| JP | 11-263860 A | | 9/1999 | |
|---|---|---|---|---|
| JP | 11263860 A | * | 9/1999 | |
| KR | 10-0686780 B1 | | 2/2007 | |
| KR | 10-1181411 B1 | | 9/2012 | |
| WO | WO 2009118457 A1 | * | 10/2009 | ........... C23C 16/042 |

OTHER PUBLICATIONS

Choi et al (Super-hydrophobic coatings with nano-size roughness prepared with simple PECVD method, J. Phys. D: Appl Phys. 46 (2013) 315501, pp. 1-6. Published on Jul. 10, 2013.).*
Jeon G. Han, "Application of Plasma-Nano Process for Bio Materials", IFFM 2013, p. 145, Jun. 27, 2013 (3 pages).
Yoon S Choi, et al., "Super-hydrophobic coatings with nano-size roughness prepared with simple PECVD method", IOP Science, Jul. 10, 2013 (7 pages).
Yoon S. Choi, et al., "Film Structure and Process Design of Super-Hydrophobic and Oleophobic coatings by simple PECVD method", AEPSE 2013, Aug. 25, 2013 (3 pages).
J. Han, et al., "Super-hydrophobic films synthesis by MOPECVD at Low Temperature", IVC-19, Sep. 9, 2013 (4 pages).

* cited by examiner

Primary Examiner — Melvin C Meyes
Assistant Examiner — Michael Forrest
(74) Attorney, Agent, or Firm — NSIP Law

(57) ABSTRACT

A super-hydrophobic thin film and a method of preparing the same are provided. The method of preparing the super-hydrophobic thin film involves forming a super-hydrophobic thin film by plasma enhanced chemical vapor deposition (PECVD) on a substrate by using a precursor and a hydrogen gas.

11 Claims, 5 Drawing Sheets

PURE SiO$_x$

| 45 sccm | 60 sccm | 75 sccm | ial
SUPER-HYDROPHOBIC THIN FILM AND METHOD FOR PREPARING THE SAME

CROSS-REFERENCE TO RELATED APPLICATION

This application claims the benefit under 35 USC 119(a) of Korean Patent Application No. 10-2014-0022202 filed on Feb. 25, 2014, in the Korean Intellectual Property Office, the entire disclosures of which is incorporated herein by reference for all purposes.

BACKGROUND

1. Field

The following description relates to a super-hydrophobic thin film and a method of preparing the super-hydrophobic thin film.

2. Description of Related Art

Plasma refers to a state of matter comprising ionized gas. Plasma may be characterized as the fourth state of matter because plasma significantly differs from a gas in its normal state in terms of its electrical and thermal properties.

Hydrophobicity refers to a property of molecules or solid whose surface does not easily bond with water molecules or which rejects and is repelled from water. Since nonpolar functional groups such as —$CH_2$, —$CH_3$, —CCl, and —CF enhance the hydrophobic property of molecules, they are refereed to as hydrophobic groups. A hydrophobic thin film is used in various fields such as dust resistance, self cleaning, anti-fog, and anti-fingerprint, and so on.

Recently, hydrophobic thin films have been formed through various methods. Examples of employed techniques include UV coating, spin coating, electron-beam deposition, sol-gel method and so on. However, because it is difficult to obtain a super-hydrophobic thin film only from the deposition of a thin film, a method that coats a hydrophobic thin film on a substrate formed with a pattern is used. However, this process is undesirable in that it requires a lot of time and uses a toxic gas as well as a high processing temperature of approximately 200° C. or higher.

Korean Patent No. 10-0686780 relates to structure of hydrophobic organic thin layer and a method of production thereof, and describes a hydrophobic organic thin film deposited on a surface modified by physical scratches. This process is disadvantageous in that it requires a long processing time and complicated fabrication process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of preparing a super-hydrophobic thin film involves forming a super-hydrophobic thin film by plasma enhanced chemical vapor deposition (PECVD) on a substrate by using a precursor and a hydrogen gas.

The super-hydrophobic thin film may include a hydrophobic silicon thin film.

The precursor may include a silicon precursor.

The silicon precursor may include a member selected from the group consisting of hexamethyldisilane, trimethylsilane, tetraethylorthosilicate, hexamethyldisiloxane, octamethylcyclotetrasiloxane, and combinations thereof.

The PECVD may be performed at a temperature below 30° C.

A flow rate of the hydrogen gas may be controlled according to a size of a chamber for the PECVD.

A power density used in the PECVD may be between approximately 0.5 W/cm$^2$ and approximately 3 W/cm$^2$.

A process pressure used in the PECVD may be between approximately 50 mTorr and approximately 300 mTorr.

The super-hydrophobic thin film may have a surface contact angle of 140° or greater.

In another general aspect, a super-hydrophobic thin film is prepared by the method described above, and the super-hydrophobic thin film has a hydrophobic group on its surface.

The hydrophobic group may include a member selected from the group consisting of a $C_{1-6}$ alkyl group, a $C_{1-6}$ alkylene group, a fluoro-$C_{1-6}$-alkyl group, a fluoro-$C_{1-3}$-alkylene group, and combinations thereof.

A surface contact angle of the super-hydrophobic thin film may range between approximately 140° and approximately 170°

Other features and aspects will be apparent from the following detailed description, the drawings, and the claims.

Figure 1:
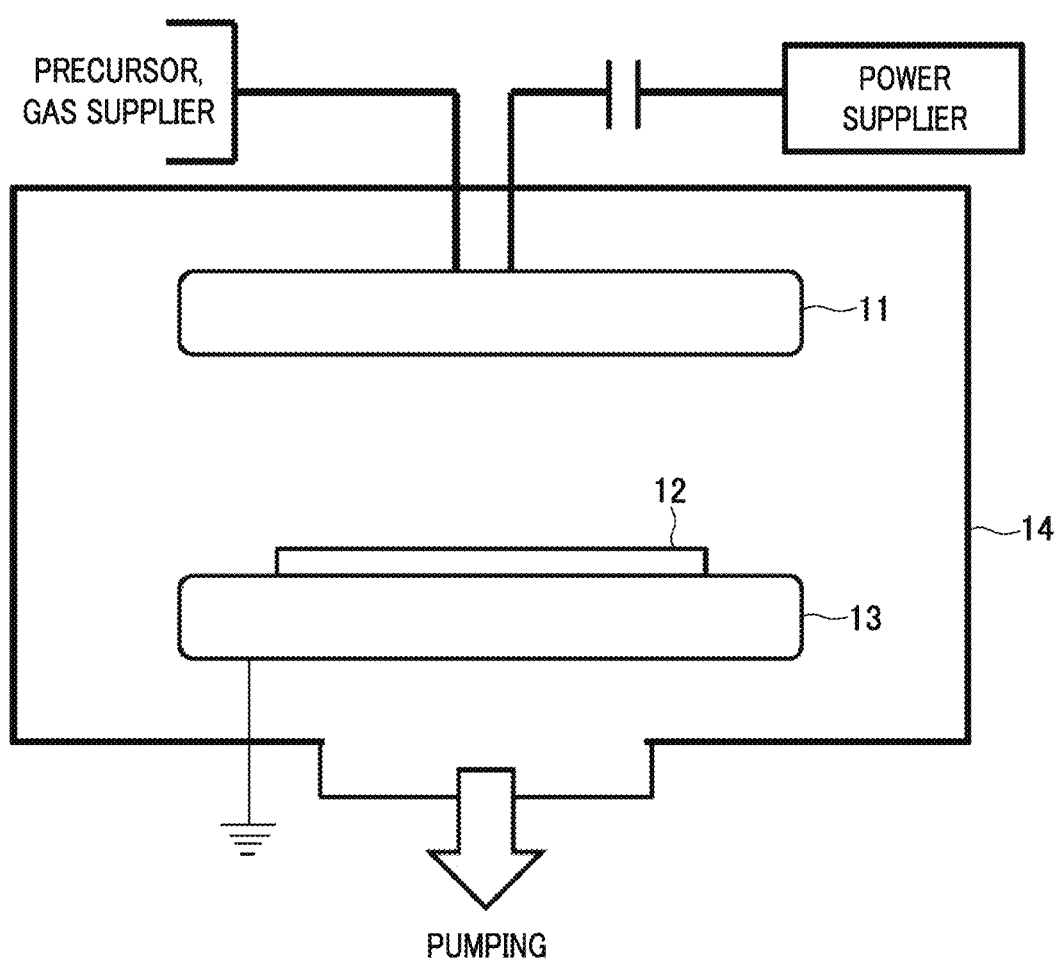
FIG. 1 is a schematic view illustrating plasma enhanced chemical vapor deposition (PECVD) equipment that is used during an example of a method of preparing a super-hydrophobic thin film.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the present disclosure, the terms "connected to" or "coupled to" are used to designate a connection or coupling of one element to another element and include both a case where an element is "directly connected or coupled to" another element and a case where an element is "electronically connected or coupled to" another element via still another element.

Throughout the present disclosure, the term "on" that is used to designate a position of one element with respect to another element includes both a case that the one element is adjacent to the another element and a case that any other element exists between these two elements.

Throughout the present disclosure, the term "comprises or includes" and/or "comprising or including" used in the document indicate that one or more other components, steps, operations, and/or the existence or addition of elements are not excluded in addition to the described components, steps, operations and/or elements. Throughout the present disclosure, the terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party. Throughout the whole document, the term "step of" does not mean "step for."

Throughout the present disclosure, the term "combinations of" included in Markush type description means mixture or combinations of one or more components, steps, operations and/or elements selected from a group consisting of components, steps, operation and/or elements described in Markush type and thereby means that the disclosure includes one or more components, steps, operations and/or elements selected from the Markush group.

Throughout the present disclosure, the description "A and/or B" means "A or B, or A and B."

The term "super-hydrophobic" refers to highly hydrophobic characteristics, such as the difficulty to wet a surface. With a super-hydrophobic surface, the contact angle of a water droplet may 120° or greater, for example.

Throughout the present disclosure, the terms "alkyl group" may each include a linear or branched and saturated or unsaturated $C_{1-6}$ alkyl group, and for example, methyl, ethyl, propyl, butyl, pentyl, hexyl, or all possible isomers thereof but may not be limited thereto.

Throughout the present disclosure, the terms "alkylene group" may each include a linear or branched $C_{1-6}$ alkylene group, and at least one hydrogen atom of the alkylene group may be substituted with a $C_{1-6}$ alkyl group, but may not be limited thereto. In case of the substitution with the $C_{1-6}$ alkyl group, the number of carbons of the substituent is not included in the number of carbons of the alkylene group. For example, the alkylene group may include methylene, ethylene, propylene, butylene, pentylene, hexylene, or any possible isomers thereof, but may not be limited thereto. The methylene, ethylene, propylene, butylene, pentylene, hexylene, or all possible isomers thereof may be substituted with the $C_{1-6}$ alkyl group, but may not be limited thereto.

Throughout the present disclosure, the term "fluoroalkyl group" may include an alkyl group including at least one fluorine atom, but may not be limited thereto.

Throughout the present disclosure, the term "fluoroalkylene group" may include an alkylene group including at least one fluorine atom, but may not be limited thereto.

Throughout the present disclosure, the term "$SiO_x$ thin film" refers to a silica-based thin film in which x may be a value around 2 or x is 2. When x is equal to 2, a high quality thin film can be obtained; however, the x value is not limited thereto. If the $SiO_x$ thin film is formed on a substrate, adhesion to a hydrophobic thin film can be improved by performing $O_2$ or Ar plasma treatment to the $SiO_x$ thin film. If the $SiO_x$ thin film is not formed on a substrate, a hydrophobic thin film may not be easily formed, or adhesion may be weakened thereby deteriorating the durability.

Hereinafter, various examples according to the present disclosure will be described in detail with reference to the accompanying drawings. However, the present disclosure is not limited to the examples and the embodiments illustrated in the drawings.

In a first aspect of the present disclosure, there is provided a method of preparing a super-hydrophobic thin film. The super-hydrophobic thin film may be obtained by forming a super-hydrophobic thin film by plasma enhanced chemical vapor deposition (PECVD) on a substrate with the use of a precursor and a hydrogen gas.

For the substrate, a general hard or flexible substrate may be used without limitation. For example, in the event that a flexible substrate is used, a $SiO_x$ thin film may be first formed on the substrate, and then, a super-hydrophobic thin film may be formed.

In accordance with the present disclosure, the method of preparing a super-hydrophobic thin film may further involve performing plasma treatment, after forming the $SiO_x$ thin film, and the plasma treatment may be performed, for example, by $O_2$ or Ar plasma. By performing the plasma treatment, the surface of the $SiO_x$ thin film may be changed to exhibit super-hydrophobicity.

In accordance with an example embodiment of the present disclosure, the super-hydrophobic thin film may include a hydrophobic silicon thin film; however, the present disclosure is not limited thereto.

The super-hydrophobic thin film may be formed by performing plasma enhanced chemical vapor deposition (PECVD). As illustrated in FIG. 1, the PECVD process involves the use of a PECVD equipment that includes two electrodes 11, 13, whereby power is applied to an upper electrode 11, and a precursor is introduced into a chamber 14 through a shower head provided in the upper electrode 11. A lower electrode 13 may include the grounded or floated state such that the lower electrode 13 may serve as a substrate holder to locate a substrate 12 on the lower electrode 13, and plasma may be generated by a capacitive electric field formed by charges distributed on the surfaces of the upper and lower electrodes 11, 13; however, the structure of the PECVD equipment is not limited thereto.

In accordance with an example according to the present disclosure, a power density used in the PECVD equipment may range between approximately 0.5 $W/cm^2$ and approximately 0.3 W/cm²; however, the present disclosure is not limited thereto. For example, the power density of the PECVD may range from approximately 0.5 W/cm² to approximately 3 W/cm², from approximately 1 W/cm² to approximately 3 W/cm², from approximately 1.5 W/cm² to approximately 3 W/cm², from approximately 2 W/cm² to approximately 3 W/cm², from approximately 2.5 W/cm² to approximately 3 W/cm², from approximately 0.5 W/cm² to approximately 2.5 W/cm², from approximately 1 W/cm² to approximately 2.5 W/cm², from approximately 1.5 W/cm² to approximately 2.5 W/cm², from approximately 2 W/cm² to approximately 2.5 W/cm², from approximately 0.5 W/cm² to approximately 2 W/cm², from approximately 1 W/cm² to approximately 2 W/cm², from approximately 1.5 W/cm² to approximately 2 W/cm², from approximately 0.5 W/cm² to approximately 1.5 W/cm², from approximately 1 W/cm² to approximately 1.5 W/cm², or from approximately 0.5 W/cm² to approximately 1 W/cm².

In accordance with an example of the present disclosure, a process pressure used in the PECVD may range between approximately 50 mTorr and approximately 300 mTorr; however, the present disclosure is not limited thereto. For example, the process pressure of the PECVD may range from approximately 50 mTorr to approximately 300 mTorr, from approximately 75 mTorr to approximately 300 mTorr, from approximately 100 mTorr to approximately 300 mTorr, from approximately 125 mTorr to approximately 300 mTorr, from approximately 150 mTorr to approximately 300 mTorr, from approximately 175 mTorr to approximately 300 mTorr, from approximately 200 mTorr to approximately 300 mTorr, from approximately 225 mTorr to approximately 300 mTorr, from approximately 250 mTorr to approximately 300 mTorr, from approximately 275 mTorr to approximately 300 mTorr, from approximately 50 mTorr to approximately 275 mTorr, from approximately 75 mTorr to approximately 275 mTorr, from approximately 100 mTorr to approximately 275 mTorr, from approximately 125 mTorr to approximately 275 mTorr, from approximately 150 mTorr to approximately 275 mTorr, from approximately 175 mTorr to approximately 275 mTorr, from approximately 200 mTorr to approximately 275 mTorr, from approximately 225 mTorr to approximately 275 mTorr, from approximately 250 mTorr to approximately 275 mTorr, from approximately 50 mTorr to approximately 250 mTorr, from approximately 75 mTorr to approximately 250 mTorr, from approximately 100 mTorr to approximately 250 mTorr, from approximately 125 mTorr to approximately 250 mTorr, from approximately 150 mTorr to approximately 250 mTorr, from approximately 175 mTorr to approximately 250 mTorr, from approximately 200 mTorr to approximately 250 mTorr, from approximately 225 mTorr to approximately 250 mTorr, from approximately 50 mTorr to approximately 225 mTorr, from approximately 75 mTorr to approximately 225 mTorr, from approximately 100 mTorr to approximately 225 mTorr, from approximately 125 mTorr to approximately 225 mTorr, from approximately 150 mTorr to approximately 225 mTorr, from approximately 175 mTorr to approximately 225 mTorr, from approximately 200 mTorr to approximately 225 mTorr, from approximately 50 mTorr to approximately 200 mTorr, from approximately 75 mTorr to approximately 200 mTorr, from approximately 100 mTorr to approximately 200 mTorr, from approximately 125 mTorr to approximately 200 mTorr, from approximately 150 mTorr to approximately 200 mTorr, from approximately 175 mTorr to approximately 200 mTorr, from approximately 50 mTorr to approximately 175 mTorr, from approximately 75 mTorr to approximately 175 mTorr, from approximately 100 mTorr to approximately 175 mTorr, from approximately 125 mTorr to approximately 175 mTorr, from approximately 150 mTorr to approximately 175 mTorr, from approximately 50 mTorr to approximately 150 mTorr, from approximately 75 mTorr to approximately 150 mTorr, from approximately 100 mTorr to approximately 150 mTorr, from approximately 125 mTorr to approximately 150 mTorr, from approximately 50 mTorr to approximately 125 mTorr, from approximately 75 mTorr to approximately 125 mTorr, from approximately 100 mTorr to approximately 125 mTorr, from approximately 50 mTorr to approximately 100 mTorr, from approximately 75 mTorr to approximately 100 mTorr, or from approximately 50 mTorr to approximately 75 mTorr.

In accordance with an example embodiment of the present disclosure, the precursor may include a silicon precursor; however, the present disclosure is not limited thereto. For example, the silicon precursor may include a member selected from the group consisting of hexamethyldisilane (HMDS), trimethylsilane (TMS), tetraethylorthosilicate (TEOS), hexamethyldisiloxane (HMDSO), octamethylcyclotetrasiloxane (OMCTS), and combinations thereof, but may not be limited thereto.

In accordance with an example of the present disclosure, the PECVD may be performed at a room temperature; however, the present disclosure is not limited thereto. According to one example, the forming of the super-hydrophobic thin film requires significantly short process time of approximately 1 to 3 minutes, and does not necessitate additionally applying heat to the substrate. Accordingly, a temperature of the process itself is performed at almost the same temperature as the room temperature of approximately 25° C. For example, the processing temperature may be below 30° C., or be between approximately 15° C. and 40° C.

In accordance with an example of the present disclosure, a flow rate of the hydrogen gas may be controlled according to a size of a chamber for the PECVD; however, the present disclosure is not limited thereto. The flow rate of the hydrogen gas increases in proportion to the chamber size, a hydrophobic thin film having a softer surface may be formed as the flow rate of the hydrogen gas is small, and a super-hydrophobic thin film having a rougher surface may be formed as the flow rate of the hydrogen gas is large. For example, the flow rate of the hydrogen gas may be approximately 0 sccm or more, approximately 50 sccm or more, approximately 100 sccm or more, approximately 200 sccm or more, approximately 300 sccm or more, approximately 400 sccm or more, approximately 500 sccm or more, approximately 600 sccm or more, approximately 700 sccm or more, approximately 800 sccm or more, or approximately 900 sccm or more; however, the present disclosure is not limited thereto.

According to another example of the present disclosure, there is provided a super-hydrophobic thin film that is obtained by the method described above. The super-hydrophobic thin film may include a hydrophobic group on the surface thereof.

The super-hydrophobic thin film prepared by the method described above may exhibit a surface roughness of, for example, from approximately 1 nm to approximately 300 nm; however, the present disclosure is not limited thereto. The surface roughness refers to a surface that is not smooth and has a non-uniformed roughness ranging from a few nanometers to hundreds of nanometers, and may be, for example, from approximately 1 nm to approximately 300 nm, from approximately 10 nm to approximately 300 nm, from approximately 100 nm to approximately 300 nm, from approximately 150 nm to approximately 300 nm, from approximately 200 nm to approximately 300 nm, from approximately 250 nm to approximately 300 nm, from approximately 1 nm to approximately 250 nm, from approximately 10 nm to approximately 250 nm, from approximately 100 nm to approximately 250 nm, from approximately 150 nm to approximately 250 nm, from approximately 200 nm to approximately 250 nm, from approximately 1 nm to approximately 200 nm, from approximately 10 nm to approximately 200 nm, from approximately 100 nm to approximately 200 nm, from approximately 150 nm to approximately 200 nm, from approximately 1 nm to approximately 150 nm, from approximately 10 nm to approximately 150 nm, from approximately 100 nm to approximately 150 nm, from approximately 1 nm to approximately 100 nm, from approximately 10 nm to approximately 100 nm, or from approximately 1 nm to approximately 10 nm. The surface roughness of the super-hydrophobic thin film denotes a soft surface as the flow rate of the hydrogen gas is small.

In accordance with an example of the present disclosure, the hydrophobic group may include a member selected from the group consisting of a $C_{1-6}$ alkyl group, a $C_{1-6}$ alkylene group, a fluoro-$C_{1-6}$-alkyl group, a fluoro-$C_{1-3}$-alkylene group, and combinations thereof; however, the present disclosure is not limited thereto. For example, the fluoro-$C_{1-6}$-alkyl group and the fluoro-$C_{1-3}$-alkylene group may include at least one fluorine atom. For example, the hydrophobic group may include a member selected from the group consisting of methyl, ethyl, propyl, butyl, pentyl, hexyl, —$CH_2$—, —$CF_2$—, —$CF_3$, —$CHF_2$, and combinations thereof; however, the present disclosure is not limited thereto.

In accordance with an example of the present disclosure, a surface contact angle of the super-hydrophobic thin film may range between approximately 140° and approximately 170°; however, the present disclosure is not limited thereto. For example, the surface contact angle of the super-hydrophobic thin film may be from approximately 140° to approximately 170°, from approximately 145° to approximately 170°, from approximately 150° to approximately 170°, from approximately 155° to approximately 170°, from approximately 160° to approximately 170°, from approximately 165° to approximately 170°, approximately 140° to approximately 165°, from approximately 145° to approximately 165°, from approximately 150° to approximately 165°, from approximately 155° to approximately 165°, from approximately 160° to approximately 165°, from approximately 140° to approximately 160°, from approximately 145° to approximately 160°, from approximately 150° to approximately 160°, from approximately 155° to approximately 160°, from approximately 140° to approximately 155°, from approximately 145° to approximately 155°, from approximately 150° to approximately 155°, from approximately 140° to approximately 150°, from approximately 145° to approximately 150°, or from approximately 140° to approximately 145°, but may not be limited thereto.

Hereinafter, various examples of the present disclosure will be described in detail. However, the present disclosure is not limited thereto.

EXAMPLE

Figure 2:
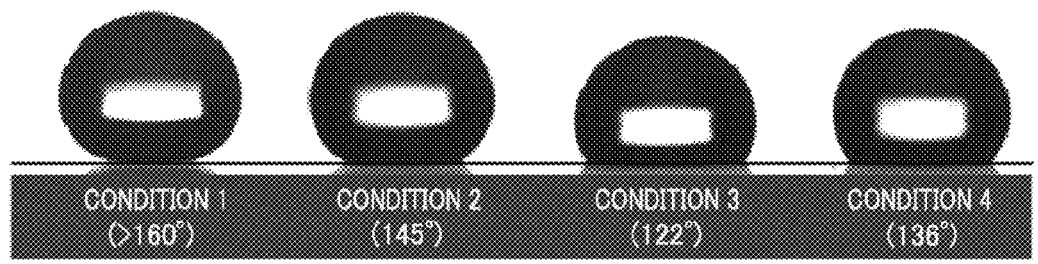
FIG. 2 includes photographs of surface image illustrating a water contact angle of 160° or larger on a surface of an example embodiment according to the present disclosure.

A super-hydrophobic thin film was formed at a room temperature by using a PECVD device with a 140 W radio frequency (RE) power. Hydrogen gas and a HMDS precursor were simultaneously supplied to the PECVD devuce, and the process pressure was set to 200 mTorr. The process time was 1 minute and 30 seconds, and when 70 sccm hydrogen gas was introduced, the contact angle was 145°, and the surface roughness was 2.5 nm. In addition, when 150 sccm hydrogen was introduced, the surface roughness was 150 nm, and the contact angle was 160° or larger, as illustrated in FIG. 2. From the results, it was identified that the surface roughness is adjustable according to a hydrogen amount and a voltage to be applied.

Figure 3:
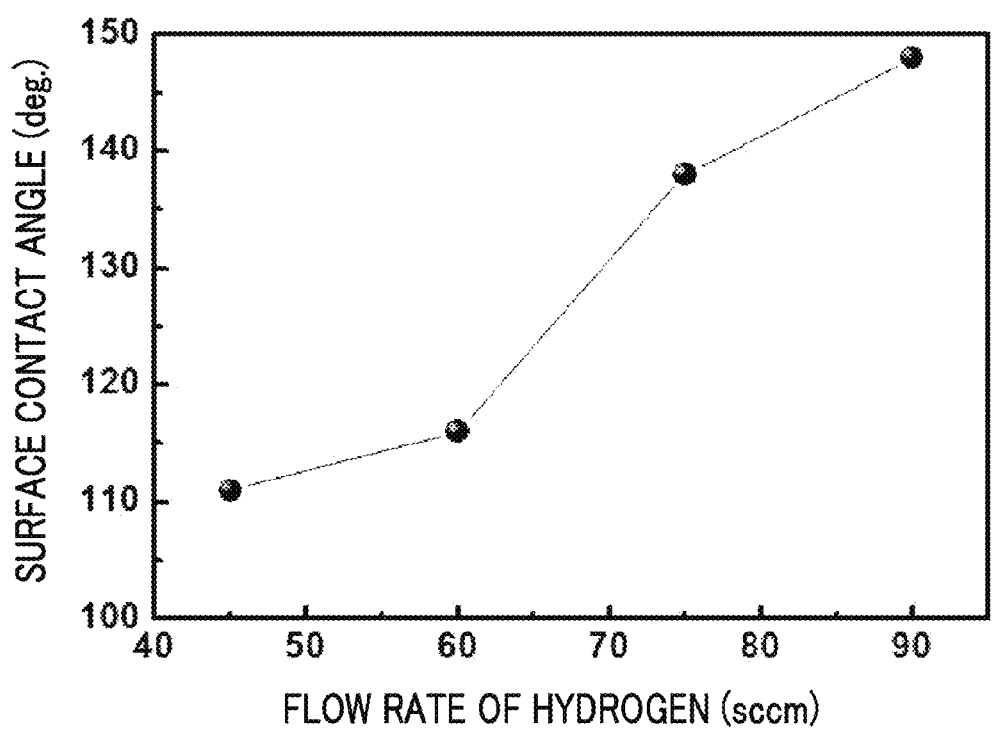
FIG. 3 is a graph illustrating a change in surface contact angle based on a change in hydrogen flow rate according to an example embodiment of the present disclosure.
Figure 4:
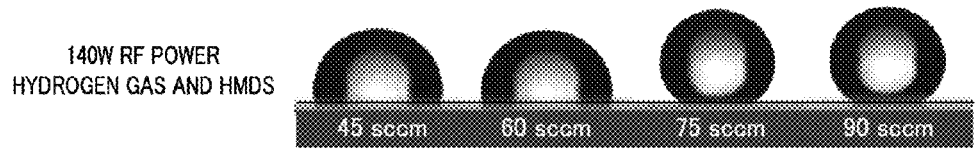
FIG. 4 includes photographs illustrating a change in surface contact angle depending on hydrogen and HMDS precursor used in accordance with an example embodiment of the present disclosure.

FIG. 3 is a graph illustrating the surface contact angle of a super-hydrophobic thin film depending on the flow rate of hydrogen and a surface contact angle image in accordance with the present example, respectively. As illustrated in FIG. 3, it was identified that as the amount of introduced hydrogen increases, the contact angle of the super-hydrophobic thin film also increases. With respect to FIG. 3, a hydrogen flow rate of greater than 75 sccm resulted in a contact angle of greater than 135°, a hydrogen flow rate of greater than 80 sccm resulted in a contact angle of greater than 140°, and a hydrogen flow rate of greater than 90 sccm resulted in a contact angle of greater than 145°.

Figure 5:
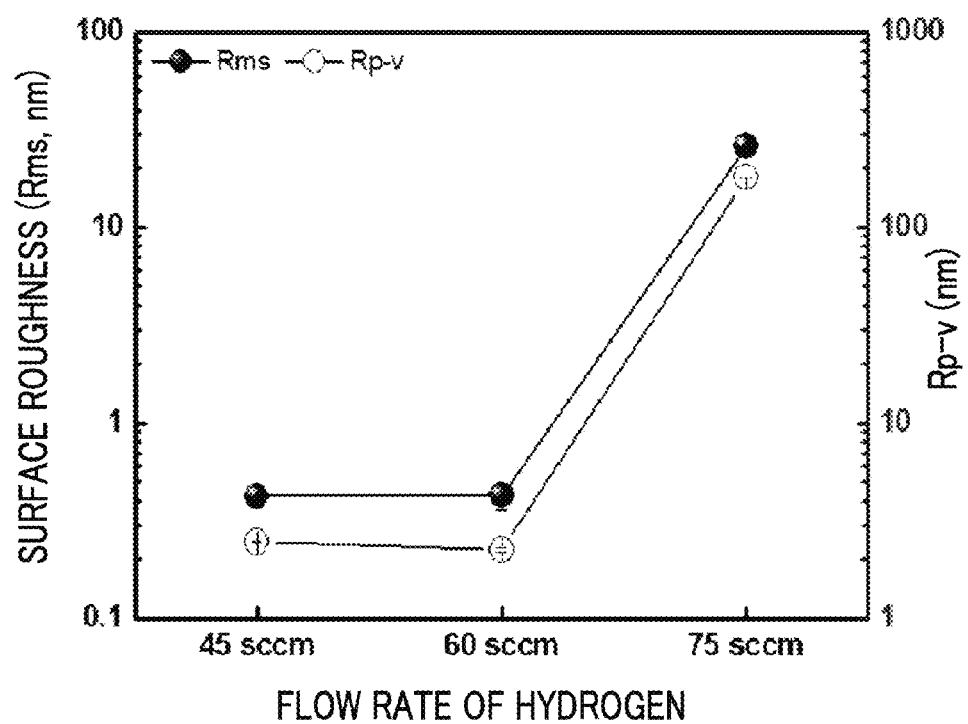
FIG. 5 is a graph illustrating a change in surface roughness based on a change in hydrogen flow rate in accordance with an example embodiment of the present disclosure.

FIG. 5 is a graph illustrating the surface roughness of the thin film based on the flow rate of hydrogen used during the fabrication process. The super-hydrophobic thin film in accordance with the present example can realize a contact angle of 145° or greater even in the case of the surface roughness of 2.5 nm through control of the amount of hydrogen. The super-hydrophobic thin film also maintained its durability in the chemical resistance test using salt water and suncream.

Figure 6:
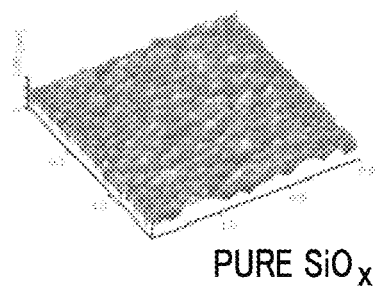
FIG. 6 is a non-contact atomic force microscopy (AFM) image illustrating a surface form depending on a hydrogen flow rate in accordance with an example embodiment of the present disclosure.
Figure 6:
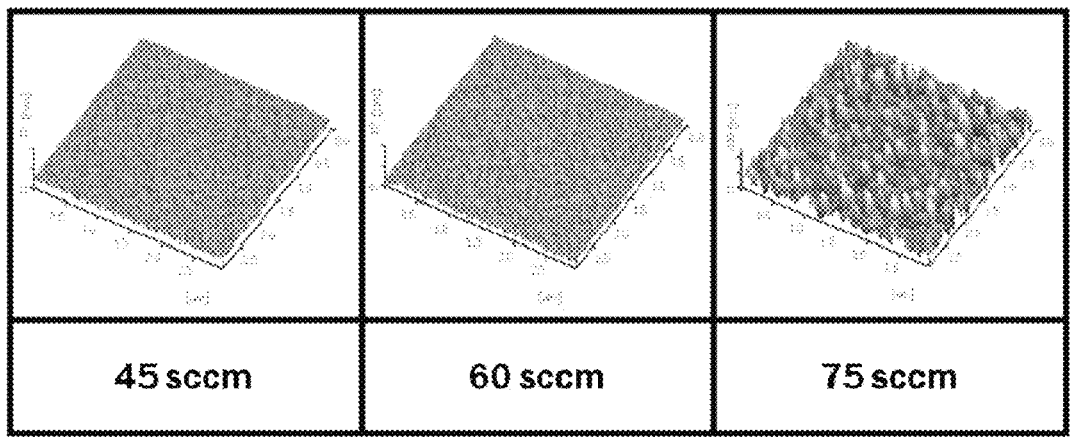

FIG. 6 includes non-contact AFM images illustrating a surface form of the super-hydrophobic thin films depending on the flow rates of hydrogen used during the fabrication process in accordance with the present example. It was identified that the surface roughness also increases as the flow rate of hydrogen increases, in comparison to a pure $SiO_x$ substrate.

Figure 7:
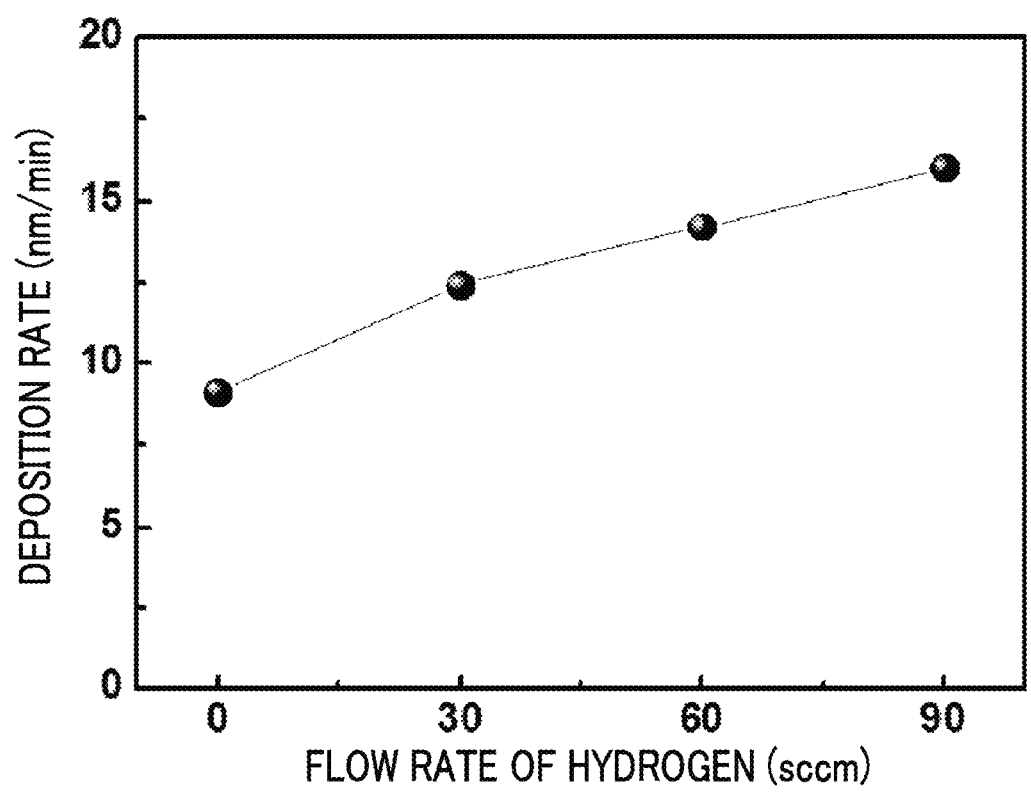
FIG. 7 is a graph illustrating a change in deposition rate of a super-hydrophobic thin film based on a change in hydrogen flow rate in accordance with an example embodiment of the present disclosure.

FIG. 7 is a graph illustrating a deposition rate of the super-hydrophobic thin film based on the flow rate in accordance with the present example. HMDS was used as a precursor, and Ar gas was used as a carrier gas. A process pressure of 180 mTorr was applied, a 0 to 90 sccm hydrogen gas was applied, and a 140 W RF power was applied. Deposition was performed at a room temperature for approximately 5 minutes. As illustrated in FIG. 7, it was identified that the deposition rate also increases as the flow rate of hydrogen increases.

Provided above are examples of super-hydrophobic thin films and methods of preparing the same.

According to one example embodiment, there is provided a method of preparing a super-hydrophobic thin film, the method involving forming a super-hydrophobic thin film by plasma enhanced chemical vapor deposition (PECVD) on a substrate by using a precursor and a hydrogen gas.

According to another example embodiment, there is provided a super-hydrophobic thin film, which is prepared by the method described above and includes a hydrophobic group in its chemical formula on the surface thereof.

In accordance with the present disclosure, the example of the super-hydrophobic thin film is formed by using PECVD equipment for a low-temperature plasma process. Accordingly, a polymer substrate or the like that is vulnerable to heat may be used as a substrate. Furthermore, without additionally inscribing a pattern to form a surface roughness, a micro surface roughness of a nano scale and a hydrophobic group are easily formed through the process, so that a high surface contact angle can be formed, and the processing time to produce the film can also be reduced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

We claim:

1. A method of preparing a super-hydrophobic thin film, the method comprising:
    forming a super-hydrophobic thin film by plasma enhanced chemical vapor deposition (PECVD) on a substrate by using a precursor and a hydrogen gas,
    wherein the super-hydrophobic thin film comprises a hydrophobic group on a surface of the super-hydrophobic thin film.

2. The method of claim 1,
    wherein the super-hydrophobic thin film comprises a hydrophobic silicon thin film.

3. The method of claim 1,
    wherein the precursor comprises a silicon precursor.

4. The method of claim 3,
    wherein the silicon precursor comprises a member selected from the group consisting of hexamethyldisilane, trimethylsilane, tetraethylorthosilicate, hexamethyldisiloxane, octamethylcyclotetrasiloxane, and combinations thereof.

5. The method of claim 1,
    wherein the PECVD is performed at a temperature below 30° C.

6. The method of claim 1,
    wherein a flow rate of the hydrogen gas is controlled according to a size of a chamber for the PECVD.

7. The method of claim 1,
    wherein a power density used in the PECVD is between approximately 0.5 W/cm$^2$ and approximately 3 W/cm$^2$.

8. The method of claim 1,
    wherein a process pressure used in the PECVD is between approximately 50 mTorr and approximately 300 mTorr.

9. The method of claim 1,
    wherein the super-hydrophobic thin film has a surface contact angle of 140° or greater.

10. The method of claim 1, wherein the hydrophobic group comprises
    a member selected from the group consisting of a C1-6 alkyl group, a C1-6 alkylene group, a fluoro-C1-6-alkyl group, a fluoro-C1-3-alkylene group, and combinations thereof.

11. The method of claim 1,
    wherein a surface contact angle of the super-hydrophobic thin film is between approximately 140° and 170°.

* * * * *